(12) United States Patent
Jordan

(10) Patent No.: US 9,553,563 B1
(45) Date of Patent: Jan. 24, 2017

(54) APPARATUS AND METHODS FOR A VARIABLE GAIN PASSIVE ATTENUATOR WITH MULTIPLE LAYER ATTENUATION DEVICES

(71) Applicant: ANALOG DEVICES, INC., Norwood, MA (US)

(72) Inventor: Edward P. Jordan, Kernersville, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/811,488

(22) Filed: Jul. 28, 2015

(51) Int. Cl.
    *H03H 11/24* (2006.01)
    *H03H 7/40* (2006.01)

(52) U.S. Cl.
    CPC .............. *H03H 11/245* (2013.01); *H03H 7/40* (2013.01)

(58) Field of Classification Search
    CPC ......... G02F 2203/48; H03H 7/38; H03H 7/40; H03H 11/24; H03H 11/245
    USPC ............................................ 327/308; 333/32
    See application file for complete search history.

(56) References Cited

U.S. PATENT DOCUMENTS

| | | | |
|---|---|---|---|
| 6,489,856 B1* | 12/2002 | Weigand | H03H 11/245 326/32 |
| 7,205,817 B1 | 4/2007 | Huang et al. | |
| 8,614,597 B2 | 12/2013 | Zhang | |
| 8,633,754 B2 | 1/2014 | Granger-Jones et al. | |
| 8,674,746 B1* | 3/2014 | Staudinger | H03H 7/25 327/333 |
| 8,890,598 B2 | 11/2014 | Jordan | |
| 2012/0280738 A1 | 11/2012 | Granger-Jones et al. | |
| 2012/0319755 A1 | 12/2012 | Zhang | |
| 2015/0358015 A1* | 12/2015 | Bawell | H01P 1/22 327/384 |

FOREIGN PATENT DOCUMENTS

CN          103427780 A       12/2013

OTHER PUBLICATIONS

Dogan et al., "Intermodulation Distortion in CMOS Attenuators and Switches", IEEE Journal of Solid-State Circuits, vol. 42, No. 3, Mar. 2007, pp. 529-539.
Dogan et al., "A DC-2.5GHz Wide Dynamic-Range Attenuator in 0.13 μm CMOS Technology", 2005 Symposium on VLSI Circuits Digest of Technical Papers, pp. 90-93.
Dogan et al., "A DC-10GHz Linear-in-dB Attenuator in 0.13 μm CMOS Technology", Custom Integrated Circuits Conference, 2004. Proceedings of the IEEE, 2004, pp. 609-612.

(Continued)

*Primary Examiner* — William Hernandez
(74) *Attorney, Agent, or Firm* — Knobbe, Martens, Olson & Bear, LLP

(57) ABSTRACT

Provided herein are apparatus and methods for a variable gain passive attenuator with multiple layer attenuation devices. In certain configurations, at least two rows of stacked FETs are layered in blocks, namely H (horizontal) blocks in a hierarchical schematic representation of the variable gain passive attenuator. Each stack of FETs receives a control signal, and by delaying a second control signal with respect to a first control signal, performance and linearity can be enhanced while insertion loss is reduced.

28 Claims, 9 Drawing Sheets

(56) References Cited

OTHER PUBLICATIONS

Granger-Jones et al., "A Broadband High Dynamic Range Voltage Controlled Attenuator MMIC with IIP3 > +47dBm over Entire 30dB Analog Control Range", Microwave Symposium Digest (MTT), 2011 IEEE MTT-S International, pp. 1-4.
Nelson et al., "A Broadband High Dynamic Range Voltage Controlled Attenuator MMIC with IIP3 > +47dBm over Entire 30dB Analog Control Range", RFMD, pp. 1-19.
"AMMP-6650 DC-30GHz Variable Attenuator", Avago Technologies Data Sheet: AV02-1337EN—Jul. 8, 2013.

* cited by examiner

APPARATUS AND METHODS FOR A VARIABLE GAIN PASSIVE ATTENUATOR WITH MULTIPLE LAYER ATTENUATION DEVICES

BACKGROUND

Field

Embodiments of the invention relate to electronic circuits, and more particularly, to voltage variable attenuators.

Description of the Related Technology

A variable gain passive attenuator can be used in RF (radio frequency) applications where variable signals require continuous adjustment. An attenuation level, relating an output power level to an input power level, can be adjusted by a control signal or control voltage within an analog feedback loop. The variable gain passive attenuator can further be adjusted to have a characteristic impedance matched to an input and output load.

In one application a variable gain passive attenuator is used in a transceiver to adjust the signal strength of a power amplifier input signal. A sample of the transmitted signal strength can be used to vary the gain of the attenuator, and in this way the power amplifier is protected from input signal overload.

In another application a variable gain passive attenuator is used in front of a LNA (low noise amplifier) to keep the total gain constant. Used within a feedback loop in the forward path of the LNA, the variable gain passive attenuator can be used for gain leveling and for impedance matching.

SUMMARY

In one embodiment a variable gain passive attenuator is configured to attenuate a signal between an input port and an output port. The attenuator variable gain passive attenuator includes a supply node, a plurality of attenuation paths, at least one supply attenuation path, and a controller. The plurality of parallel attenuation paths each comprise one or more cascade transistors that extend between the input port and the output port. A first path has a first number of transistors, and a second path has a second number of transistors different than the first number. In addition, each path has a different attenuation level, and at least one supply attenuation path extends between the plurality of attenuation paths and the supply node. The controller supplies a plurality of control signals to the plurality of parallel attenuation paths and to the at least one supply attenuation path. The controller further selects one or more paths to achieve a desired level of attenuation between the input and the output; and the controller provides control signals to separately enable at least two of the attenuation paths.

The plurality of control signals further comprise a first control signal and a second control signal sequenced in time so as to turn on the one or more cascade transistors of the first path at a first time and to turn on the one or more cascade transistors of the second path at a second time. Also, the first control signal has a first rate of change with respect to time and the second control signal has a second rate of change with respect to time. The first rate of change with respect to time, the second rate of change with respect to time, the first time, and the second time are selected to reduce a distortion of a signal of the input port and to increase linearity of the plurality of parallel attenuation paths while lowering an insertion loss between the input port and the output port. The first control signal controls the one or more cascade transistors of the first path to operate in the on state before the second control signal controls the one or more cascade transistors of the second path to operate in the on state. Also, the rate of change with respect to time of the first control signal is greater than the rate of change with respect to time of the second control signal.

The variable gain passive attenuator can further include a first parallel resistor path having a plurality of resistors electrically connected in series between the input port and the output port. The first parallel resistor path defines a first resistive impedance path between the input port and the output port; and each resistor is connected in parallel with at least one of the one or more cascade transistors of at least one of the parallel attenuation paths.

The first number of transistors of the variable gain passive attenuator can be greater than the second number of transistors of the variable gain passive attenuator. Further, each transistor of the one or more cascade transistors of the second path is electrically connected across two or more transistors of the one or more cascade transistors of the first path such that the one or more cascade transistors of the second path are stacked with respect to the one or more cascade transistors of the first path. In addition, the at least one supply attenuation path that extends between the plurality of attenuation paths and the supply node comprises one or more cascade transistors.

The variable gain passive attenuator can further comprise an impedance control module. The impedance control module is configured to provide a third control signal to the one or more cascade transistors of the at least one supply attenuation path that extends between the plurality of attenuation paths and the supply node. The impedance control module adjusts an input impedance and an output impedance of the variable gain passive attenuator to substantially equal a target impedance.

The impedance control module includes a replica attenuator configured to attenuate a signal between an auxiliary input port and an auxiliary output port by a replicated attenuation level. The replicated attenuation level is controlled by the plurality of control signals; and an input impedance and an output impedance of the replica attenuator are controlled to substantially equal a replica target impedance by the third control signal. The replicated attenuation level is substantially equal to a replica scale factor times the desired level of attenuation. A feedback loop includes the replica attenuator and an amplifier which is configured to provide the third control signal to the replica attenuator. In this way the replica target impedance substantially equals a scale factor times the target impedance. The scale factor can be equal to two.

In another embodiment a variable gain passive attenuator is configured to attenuate a signal between an input port and an output port by an attenuation level controlled by a first control signal and a second control signal. An input impedance and an output impedance of the variable gain passive attenuator are controlled to equal a target impedance by a third control signal. The variable gain passive attenuator comprises a first supply node, a first series of cascade FETs, a second series of cascade FETs, and a third series of cascade FETs. The first series of cascade FETs is configured to receive the first control signal and defines a first FET impedance path providing a first variable impedance between the input port and the output port. Additionally, the first series of cascade FETs comprises a first plurality of FETs each having a source and a drain electrically connected as a series node of the first FET impedance path. The second series of cascade FETs is configured to receive the second control signal and defines a second FET impedance path providing a second variable impedance between the input port and the output port. Additionally, the second series of cascade FETs comprises at least one FET having a source and a drain electrically stacked across two or more FETs of the first series cascade FETs. Also, the number of FETs of the at least one FET is less than the number of FETs of the first plurality of FETs. The third series of cascade FETs is configured to receive the third control signal and defines a third FET impedance path between a first series node of the first FET impedance path and the first supply node.

The variable gain passive attenuator can further comprise a first parallel resistor path having a plurality of resistors, wherein the first parallel resistor path defines a first resistive impedance path between the input port and the output port. Each FET of the first plurality of FETs has a resistor from the plurality of resistors electrically connected across its source and drain in parallel. These are connected such that the number of FETs of the first plurality of FETs equals the number of resistors of the plurality of resistors.

The variable gain passive attenuator can further comprise a second parallel resistor path having a plurality of resistors. The second parallel resistor path defines a second resistive impedance path between the first series node of the first FET impedance path and the first supply node; and the third series of cascade FETs comprises a plurality of FETs each having a source and a drain electrically connected as a series node of the third FET impedance path. Each FET of the plurality of FETs of the third series of cascade FETs has a resistor from the plurality of resistors electrically connected across its source and drain in parallel. These are connected such that the number of FETs of the plurality of FETs equals the number of resistors of the plurality of resistors.

The variable gain passive attenuator can further comprise a controller configured to provide the first and second control signals at spaced time intervals so as to selectively change the first variable impedance before changing the second variable impedance. The first control signal controls the first plurality of FETs to transition from operating in subthreshold or cutoff to operating in resistive or active mode before the second control signal controls the at least one FET of the second series cascade of FETs to transition from operating in subthreshold or cutoff to operating in resistive or active mode.

The variable gain passive attenuator can include an impedance control module configured to provide the third control signal so as to adjust the input and the output impedance of the variable gain passive attenuator to equal the target impedance. The impedance control module can comprise a replica attenuator configured to attenuate a signal between an auxiliary input port and an auxiliary output port by a replicated attenuation level. The replicated attenuation level is controlled by the first control signal and the second control signal. An input impedance and an output impedance of the replica attenuator are controlled to equal a replica target impedance by the third control signal. The replicated attenuation level is equal to a replica scale factor times the attenuation level. The impedance control module can also include a feedback loop comprising the replica attenuator and an amplifier. The amplifier is configured to provide the third control signal to the replica attenuator so as to cause the replica target impedance to equal a scale factor times the target impedance; and the scale factor can be equal to two.

The second variable impedance can be larger than the first variable impedance, and the first supply node can be ground. Additionally, the variable gain passive attenuator can be a T-type attenuator.

The variable gain passive attenuator can further include a fourth series of cascade FETs and a third parallel resistor path. The fourth series of cascade FETs is configured to receive the third control signal and defines a fourth FET impedance path between a second series node of the first FET impedance path and the first supply node. The third parallel resistor path has a plurality of resistors and defines a third resistive impedance path between the second series node of the first FET impedance path and the first supply node. Additionally, the fourth series of cascade FETs comprises a plurality of FETs each having a source and a drain electrically connected as a series node of the fourth FET impedance path. Each FET of the plurality of FETs of the fourth series of cascade FETs has a resistor from the plurality of resistors of the third parallel resistor path electrically connected across its source and drain in parallel. These are connected such that the number of FETs of the plurality of FETs of the fourth series of cascade FETs equals the number of resistors of the plurality of resistors of the third parallel resistor path. The variable gain passive attenuator can be either a Pi-type attenuator or a multi-T-type attenuator; and the first, second, third, and fourth series of cascade FETs comprise either NFETs or PFETs.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
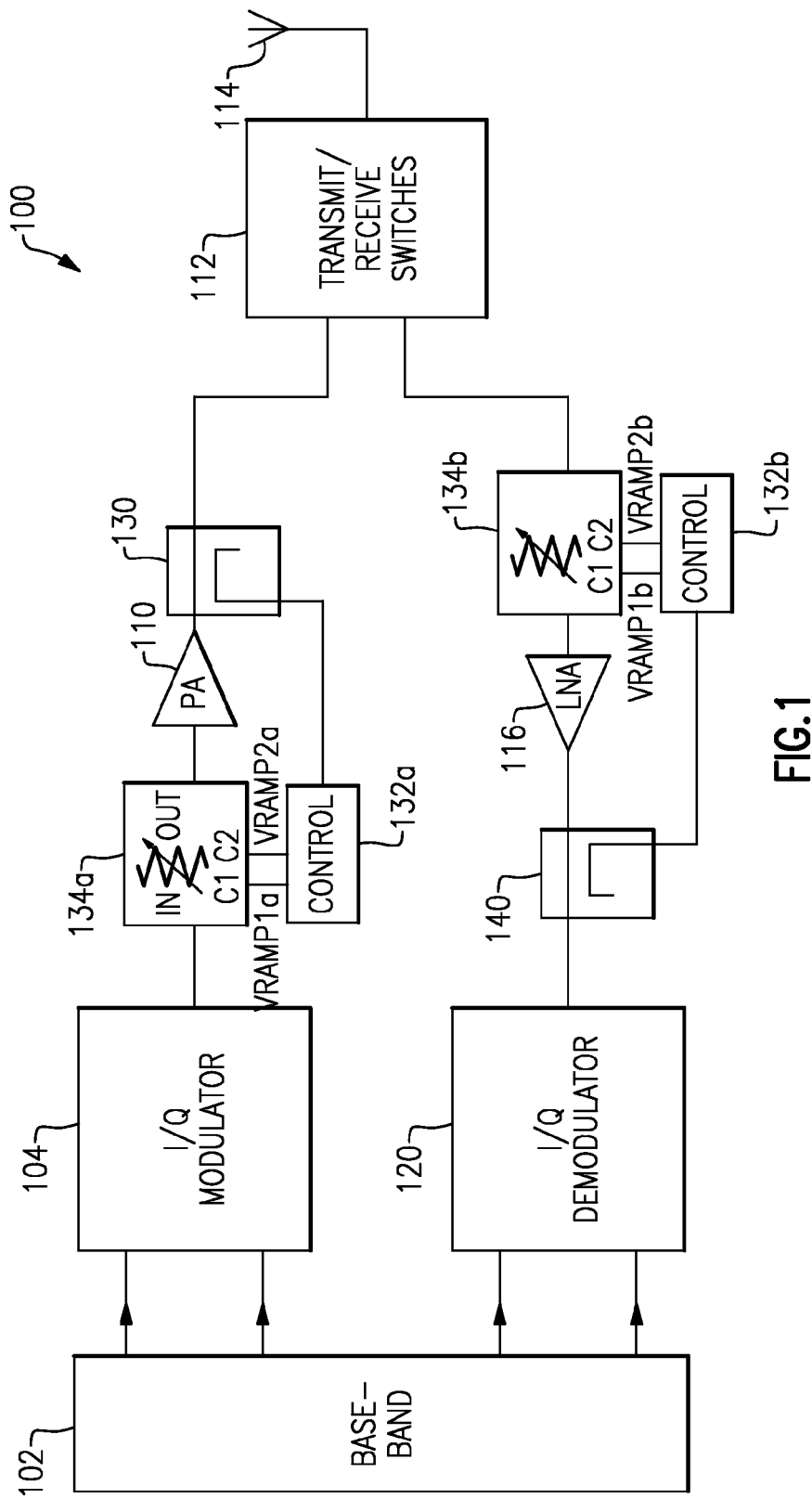
FIG. 1 is a system level diagram of an RF system including variable gain passive attenuators in accordance with the teachings herein.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

RF (radio frequency) systems having signals of variable strength require gain control in the signal path. For instance, the power of a received signal depends upon the distance between the base station and the receiver, and a variable gain passive attenuator can be used to control the incident power to the receiver path. Similarly, the power of a transmitted cell phone can be variable, and a variable gain passive attenuator can be used to control the output power of the transmitted signal. In this way the link between the cell phone and the base station can be effectively maintained.

Variable gain passive attenuators, also known as voltage variable attenuators, can be used within an RF system to reduce the amplitude or power of an RF signal without causing a significant distortion to its waveform. A variable gain passive attenuator uses elements, such as FETs (field effect transistors), to provide variable resistance controlled by one or more control voltages; and desirable properties of a variable gain passive attenuator include linearity, a high IP3 (RF third-order intercept point), low distortion, and low insertion loss.

In general, passive attenuators can be linearized by using many FETs to divide the input signal between an input port and an output port. This lowers a modulation voltage across each FET so as to improve linearity. However, such an arrangement can require using many FETs of relatively large size; therefore, a passive attenuator using many FETs can become area intensive. In addition, the parasitic capacitance associated with large area FETs can lead to reduced bandwidth, and having many FETs forming multiple series devices can lead to high insertion loss.

Accordingly, there is a need for passive attenuators with improved linearity, with lower insertion loss, and with higher bandwidth using FETs in an area efficient manner.

Provided herein are apparatus and methods for a variable gain passive attenuator with multiple layer attenuation devices. By using more than one row of stacked FETs, a variable gain passive attenuator that has high linearity, a high IP3, high frequency operation, low insertion loss, and reduced area can be realized. By stacking banks of FETs with resistors in rows and by controlling the gates of the FETs using a delayed turn on sequence, high linearity can be maintained with reduced FET area.

FIG. 1 is a system level diagram of an RF system 100 including variable gain passive attenuators in accordance with the teachings herein. Baseband I/Q signals derived from the baseband system block 102 are modulated within the I/Q modulator block 104 and follow a forward signal path through a variable gain passive attenuator 134a, a coupler 130, a PA (power amplifier) 110 into a transmit/receive switches block 112. The transmit/receive switches block 112 can pass the signal to the RF antenna 114.

The coupler 130 can feedback a sample from the output of the PA 110 to a control module 132a. The control module 132a can, in turn based upon the sample, provide signals VRAMP1a and VRAMP2a to the variable gain passive attenuator 134a so as to control the amount of attenuation of a power signal received by the PA 110. In this way the output power of the PA 110 is regulated.

In FIG. 1 the switches block 112 can also pass a received RF signal from antenna 114 along the return signal path through the transmit/receive switches block 112, a variable gain passive attenuator 134b, an LNA (low noise amplifier) 116, a coupler 140 into the I/Q demodulator 120, which provides demodulated I/Q signals to the baseband system block 102.

The coupler 140 can feedback a sample from the output of the LNA 116 to a control module 132b. The control module 132b can, in turn based upon the sample, provide signals VRAMP1b and VRAMP2b to the variable gain passive attenuator 134b so as to control the amount of attenuation of a power signal received by the LNA 116. In this way the output power of the LNA 116 is regulated.

Figure 2A:
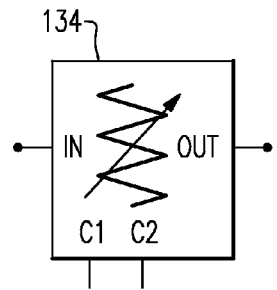
FIGS. 2A and 2B are the hierarchical circuit symbol and circuit schematic of a variable gain passive attenuator in accordance with the teachings herein.
Figure 2B:
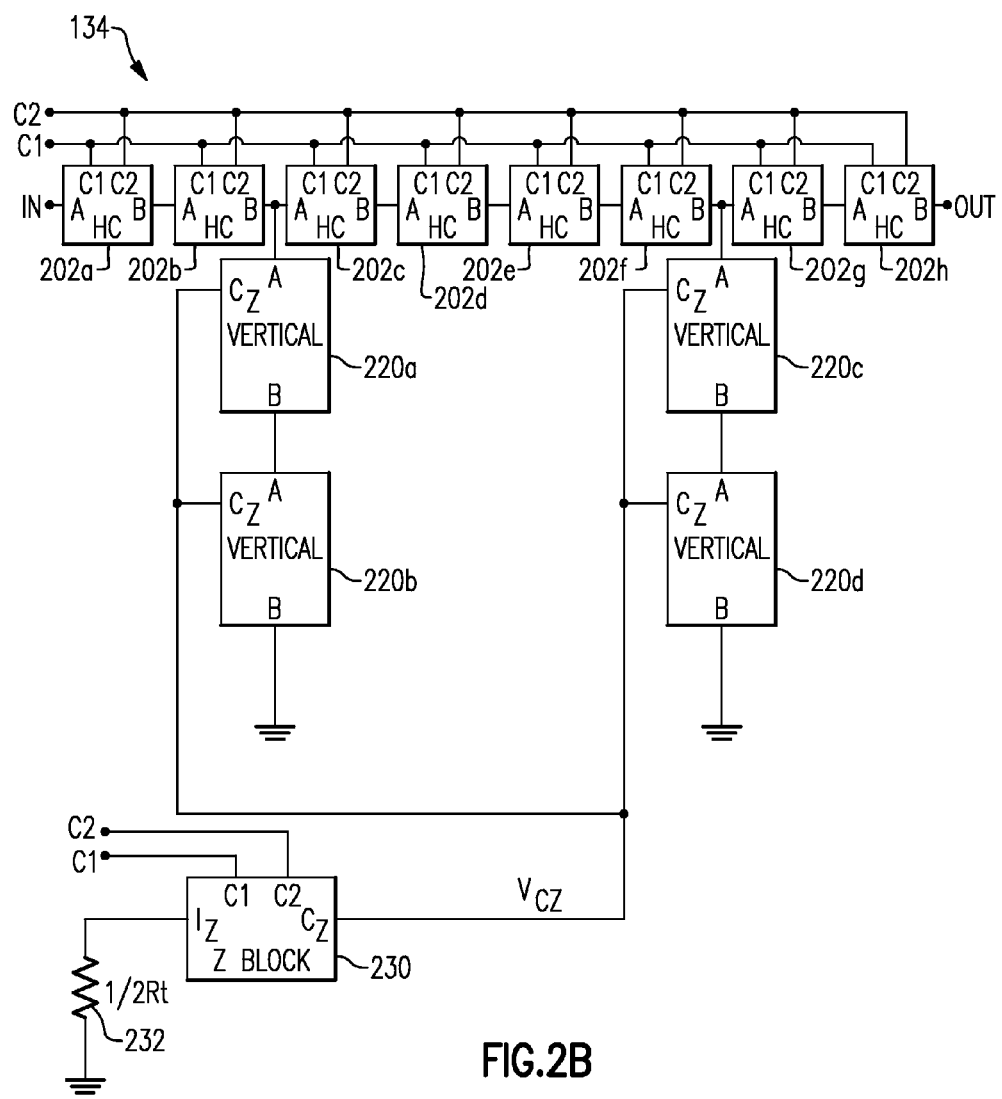

FIGS. 2A and 2B are the hierarchical circuit symbol and circuit schematic of a variable gain passive attenuator 134 in accordance with the teachings herein. Here hierarchical, a term well known to VLSI (very large scale integration) and analog circuit design engineers, means the circuit symbol of FIG. 2A is a succinct "black box" or block representation of the details of the circuit schematic shown in FIG. 2B. A hierarchical schematic allows the design engineer to succinctly draw a schematic having repetitive sub-circuits or blocks.

The hierarchical circuit symbol of FIG. 2A has an input port IN, an output port OUT, a control terminal C1, and a control terminal C2. Also consistent with a design hierarchy, ports relating to circuit biasing such as a supply port and ground are not shown; instead, they are treated as global ports, a hierarchical design concept also well known to circuit design engineers. The circuit schematic of FIG. 2B, in turn, shows the sub-circuit block connections to the input port IN, the output port OUT, the control terminal C1, and the control terminal C2.

In the embodiment of FIG. 2B, a series cascade of eight HC blocks 202a-202h are connected between the input port IN and the output port OUT. An HC block 202a has an input port A electrically connected to the input port IN and an output port B electrically connected to an input port A of an HC block 202b. An output port B of the HC block 202b is electrically connected to an input port A of an HC block 202c. An output port B of the HC block 202c is electrically connected to an input port A of an HC block 202d. An output port B of the HC block 202d is electrically connected to an input port A of an HC block 202e. An output port B of the HC block 202e is electrically connected to an input port A of an HC block 202f. An output port B of the HC block 202f is electrically connected to an input port A of an HC block 202g. An output port B of the HC block 202g is electrically connected to an input port A of an HC block 202h. And finally the output port B of the HC block 202h is electrically connected to the output port OUT.

The HC blocks 202a-202h each have a sub-circuit control terminal C1 electrically connected to the control terminal C1 and a sub-circuit control terminal C2 electrically connected to the control terminal C2. Having more than one sub-circuit control terminal can advantageously allow the use of more than one control signal to control the behavior of each HC block; and having more than one control signal can offer additional degrees of design freedom to enhance the linearity and performance of the variable gain passive attenuator 134.

Additionally, two sets of VERTICAL blocks, 220a-220b and 220c-220d, are connected between ground and the series cascade of HC blocks 202a-202h to form T-type stages. In the first set of VERTICAL blocks 220a-220b an input port A of a VERTICAL block 220a is electrically connected to the output port B of the HC block 202b, and an input port A of a VERTICAL block 220b is electrically connected to the output port B of the VERTICAL block 220a. The output port B of the VERTICAL block 220b is electrically connected to ground.

In the second set of VERTICAL blocks 220c-220d an input port A of a VERTICAL block 220c is electrically connected to the output port B of the HC block 202f, and an input port A of a VERTICAL block 220d is electrically connected to the output port B of the VERTICAL block 220c. The output port B of the VERTICAL block 220d is electrically connected to ground.

Also, as shown in FIG. 2B, the VERTICAL blocks 220a-220d each have a sub-circuit control terminal $C_Z$ receiving a control voltage Vcz. The control voltage Vcz is provided at the output port $C_Z$ of a Z block 230. The control voltage Vcz can be an analog voltage causing an input impedance and an output impedance of the variable gain passive attenuator 134 to be matched to a resistance of value Rt. As shown in the schematic of FIG. 2B, a resistor 232 of value one-half of Rt is electrically connected between ground and an input port $I_Z$ of the Z block 230. In addition, the Z block 230 also has a sub-circuit control terminal C1 electrically connected to the control terminal C1 and a sub-circuit control terminal C2 electrically connected to the control terminal C2.

Although FIG. 2A and FIG. 2B show the hierarchical circuit symbol and circuit schematic of the variable gain passive attenuator 134 as having only two control terminals C1 and C2, other configurations having more than two control terminals are possible. For instance, a variable gain passive attenuator could have an additional control terminal C3 such that each HC block and the Z block are designed with an additional sub-circuit control terminal C3. The purpose of the additional control terminal C3 can be to provide yet another degree of design freedom. For instance, as will be discussed with respect to FIG. 6B, having three control signals C1, C2, and C3 to control gates of FETs can further linearize a transfer curve of input voltage verses output attenuation with little degradation in frequency roll-off.

Figure 3A:
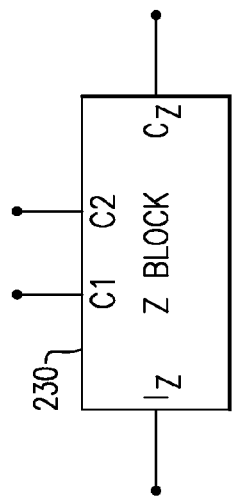
FIGS. 3A and 3B are the hierarchical circuit symbol and circuit schematic of a Z Block according to one embodiment.
Figure 3B:
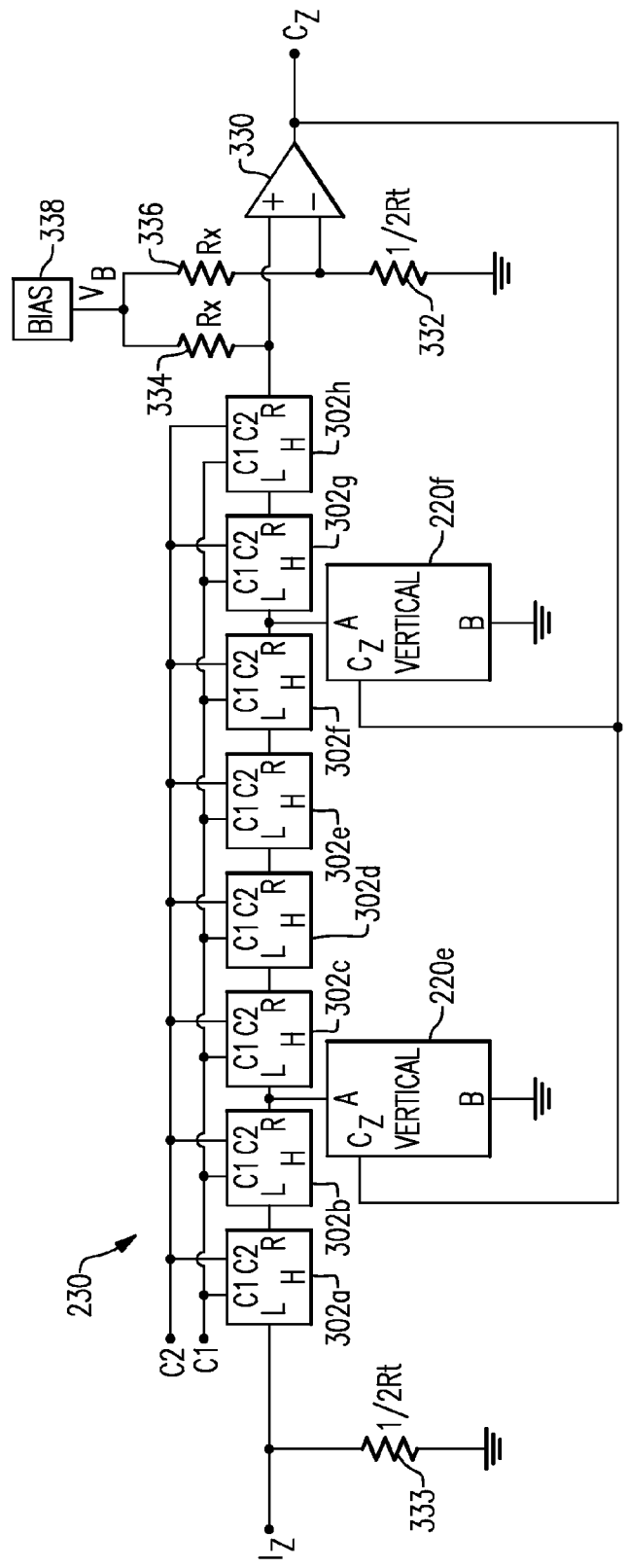

FIGS. 3A and 3B are the hierarchical circuit symbol and circuit schematic of a Z block 230 according to one embodiment. The hierarchical circuit symbol of FIG. 3A has an input port $I_Z$, an output port $C_Z$, a sub-circuit control terminal C1, and a sub-circuit control terminal C2. The circuit schematic of FIG. 3B, in turn, shows the sub-circuit block connections to the input port $I_Z$, the output port $C_Z$, the sub-circuit control terminal C1, and the sub-circuit control terminal C2.

The Z block 230 is a series cascade of eight H blocks 302a-302h connected between the input port $I_Z$ and a non-inverting input of an op-amp (operational amplifier) 330. By design the series connection of H blocks 302a-302h in FIG. 3B is similar to the series connection of HC blocks 202a-202h of FIG. 2B. In this way the Z block 230 replicates a scaled equivalent of the variable gain passive attenuator 134. An H block 302a has an input port L connected to the input port $I_Z$ and an output port R electrically connected to an input port L of an H block 302b. An output port R of the H block 302b is electrically connected to an input port L of an H block 302c. An output port R of the H block 302c is electrically connected to an input port L of an H block 302d. An output port R of the H block 302d is electrically connected to an input port L of an H block 302e. An output port R of the H block 302e is electrically connected to an input port L of an H block 302f. An output port R of the H block 302f is electrically connected to an input port L of an H block 302g. An output port R of the H block 302g is electrically connected to an input port L of an H block 302h. And finally the output port R of the H block 302h is electrically connected to the non-inverting input of the op-amp (operational amplifier) 330.

Similar to the HC blocks 202a-202h of FIG. 2B, the H blocks 302a-302h each have a sub-circuit control terminal C1 electrically connected to the control terminal C1 and a sub-circuit control terminal C2 electrically connected to the control terminal C2.

Additionally, by design half the number of VERTICAL blocks, as compared to the sets of VERTICAL blocks 220a-220d in FIG. 2B, are connected between ground and the series cascade of H blocks. A VERTICAL block 220e and a VERTICAL block 220f are electrically connected to form T-type stages similar to the manner in which the sets of VERTICAL blocks, 220a-220b and 220c-220d, of FIG. 2B are electrically connected to form T-type stages. The VERTICAL block 220e is electrically connected between an output port R of the H block 302b and ground, while the VERTICAL block 220f is electrically connected between an output port R of the H block 302f and ground. The VERTICAL block 220e and the VERTICAL block 220f are by design similar to the VERTICAL blocks 220a-220d in that each have a sub-circuit control terminal $C_Z$. In the Z block 230 an output of the op-amp 330 is electrically connected to the sub-circuit control terminal $C_Z$ of the VERTICAL block 220e and the sub-circuit control terminal $C_Z$ of the VERTICAL block 220f.

The op-amp 330 with a resistor 334 of resistance Rx, a resistor 336 of resistance Rx, a resistor 332 of resistance Rt/2, and a resistor 333 of resistance Rt/2 are configured to force a control voltage at the output of the op-amp 330. A bias block 338 provides a bias voltage VB to a first terminal of the resistor 334 and to a first terminal of the resistor 336. A second terminal of the resistor 334 is electrically connected to the non-inverting terminal of the op-amp 330, while a second terminal of the resistor 336 is electrically connected to the inverting terminal of the op-amp 330. The resistor 332 is electrically connected between the inverting terminal of the op-amp 330 and ground; and the resistor 333 is electrically connected between the input port $I_Z$ and ground.

By virtue of a feedback loop including the series cascade of H blocks 302a-302h, the op-amp 330 forces a voltage at the output of the op-amp 330 to the output port $C_Z$ of the Z block and to the sub-circuit control terminal $C_Z$ of the VERTICAL block 220e and of the VERTICAL block 220f. The voltage at the output of the op-amp 330 will by design force the input impedance at the input port $I_Z$ of the Z block 230 to be equal to the resistance (Rt/2) of the resistor 332.

Figure 4A:
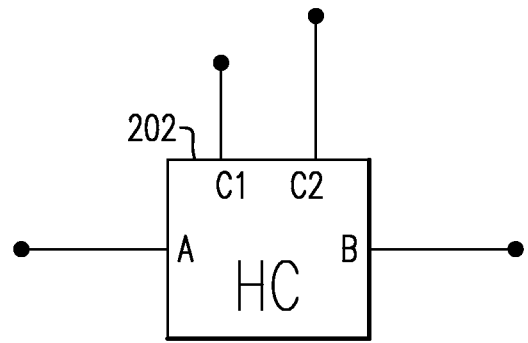
FIGS. 4A and 4B are the hierarchical circuit symbol and circuit schematic of an HC Block according to one embodiment.
Figure 4B:
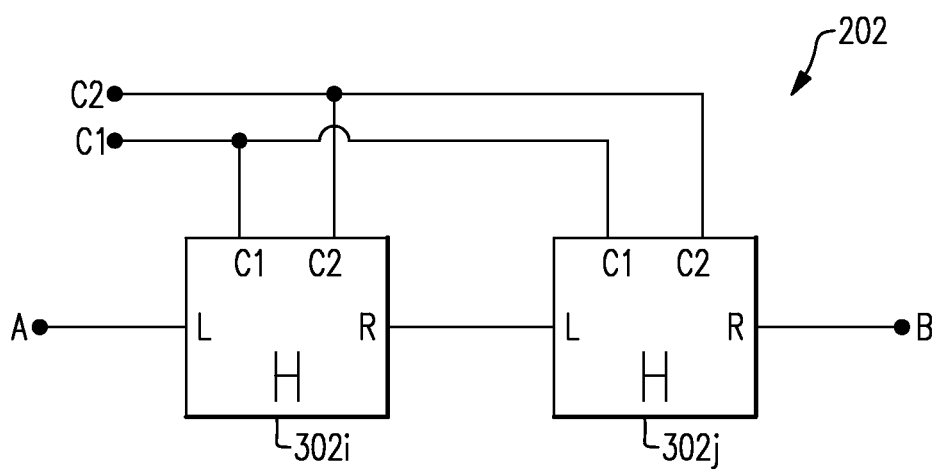

FIGS. 4A and 4B are the hierarchical circuit symbol and circuit schematic of an HC block 202 according to one embodiment. The hierarchical circuit symbol of FIG. 4A has an input port A, an output port B, a sub-circuit control terminal C1, and a sub-circuit control terminal C2. The circuit schematic of FIG. 4B, in turn, shows the sub-circuit block connections to the input port A, the output port B, the sub-circuit control terminal C1, and the sub-circuit control terminal C2. More specifically, FIG. 4B shows that the HC block 202 is equivalent to a series cascade of two H blocks 302i and 302j. An H block 302i has an input port L electrically connected to the input port A and an output port R electrically connected to an input port L of an H block 302j. An output port R of the H block 302j is electrically connected to the output port B. Thus, within the hierarchical schematic design, an HC block is equivalent two H blocks electrically connected in cascade; and the impedance of an HC block is twice the impedance of an H block.

Figure 5A:
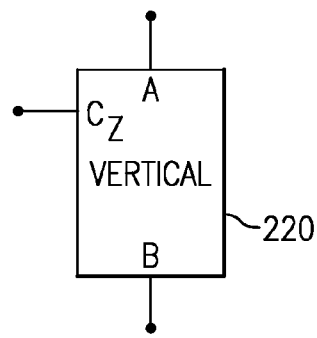
FIGS. 5A and 5B are the hierarchical circuit symbol and circuit schematic of a vertical sub-circuit according to one embodiment.
Figure 5B:
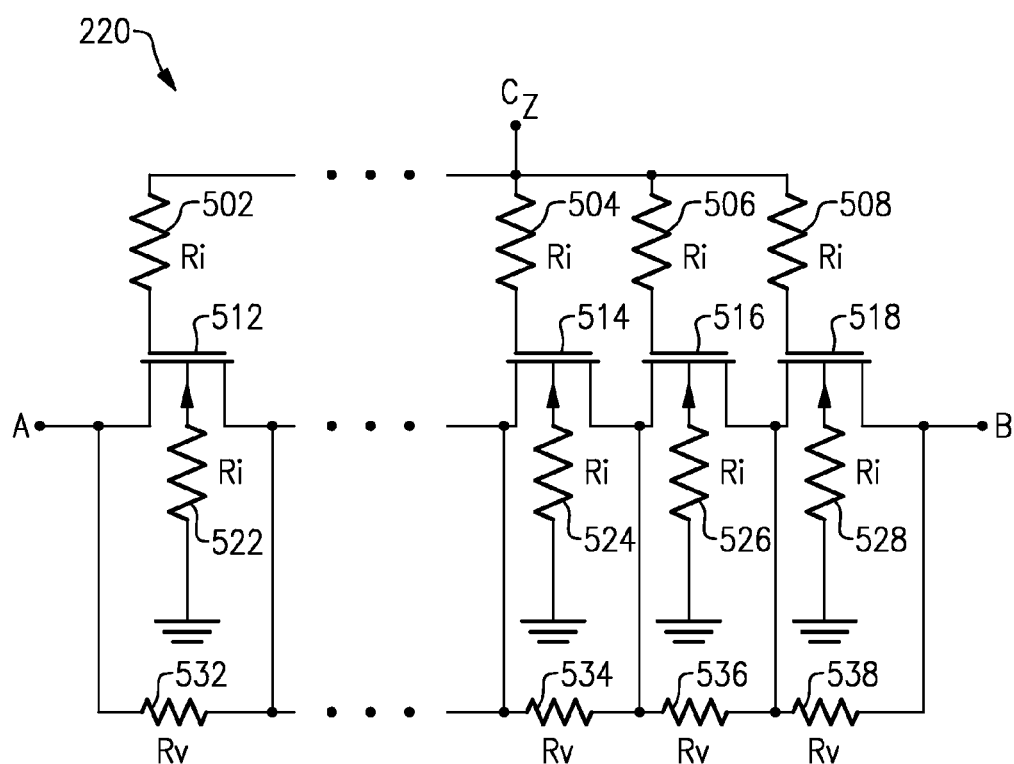

Because the series cascade of H blocks 302a-302h with the VERTICAL block 220e and the VERTICAL block 220f of FIG. 3B present one-half the resistance of the series cascade of HC blocks 202a-202h with the two sets of VERTICAL blocks, 220a-220b and 220c-220d of FIG. 2B, the control voltage Vcz of FIG. 2B from the Z block 230 forces the variable gain passive attenuator 134 to operate with an input impedance and an output impedance of value Rt. In addition, using the Z block 230 with one-half the resistance of the series cascade of HC blocks 202a-202h of FIG. 2B can advantageously reduce the component area compared to using a Z block with equivalent resistance. As one of ordinary skill in the art can appreciate, the Z block 230 replicates the variable gain passive attenuator 134 using a replica target impedance. In this way, the Z block 230 can also be referred to as an impedance control module for controlling the input impedance and the output impedance to match or equal a desired target impedance. FIGS. 5A and 5B are the hierarchical circuit symbol and circuit schematic of a VERTICAL block 220 according to one embodiment. The hierarchical circuit symbol of FIG. 5A has an input port A, an output port B, and a sub-circuit control terminal $C_Z$. The circuit schematic of FIG. 5B, in turn, shows the transistor-level connections to the input port A, the output port B, and the sub-circuit control terminal $C_Z$.

The VERTICAL block 220 is a series cascade of FETs and resistors between the input port A and the output port B. In addition, the FETs of the embodiment of FIG. 5B are N-type FETs (NFETs). At the input port A side of the cascade, an FET 512 has a source electrically connected to the input port A and a drain electrically connected to a source of an FET 514. At the output port B side of the cascade, an FET 518 has a drain electrically connected to the output port B and a source electrically connected to a drain of an FET 516. Also, the FET 514 has a drain electrically connected the source of the FET 516. As indicated by continuation ellipses, the series cascade can include any number of FETs; and while the embodiment of FIG. 5B shows the series cascade to include four FETs, the series cascade can have fewer or greater than four FETs.

Additionally, as shown in the embodiment of FIG. 5B, each FET has an associated gate and body resistor of resistance Ri. A gate resistor 502 is electrically connected between a gate of the FET 512 and the sub-circuit control terminal $C_Z$, and a body resistor 522 is electrically connected between a body of the FET 512 and ground. Similarly, a gate resistor 504 is electrically connected between a gate of the FET 514 and the sub-circuit control terminal $C_Z$, and a body resistor 524 is electrically connected between a body of the FET 514 and ground. Next, a gate resistor 506 is electrically connected between a gate of the FET 516 and the sub-circuit control terminal $C_Z$, and a body resistor 526 is electrically connected between a body of the FET 516 and ground. Finally, a gate resistor 508 is electrically connected between a gate of the FET 518 and the sub-circuit control terminal $C_Z$, and a body resistor 528 is electrically connected between a body of the FET 518 and ground.

Also as shown in FIG. 5B, each FET has an associated parallel resistor of resistance Rv. A resistor 532 is electrically connected between the drain and the source of the FET 512. A resistor 534 is electrically connected between the drain and the source of the FET 514. A resistor 536 is electrically connected between the drain and the source of the FET 516, and finally a resistor 538 is electrically connected between the drain and the source of the FET 518.

Including the resistors 532-538 can advantageously improve the linearity and enhance performance of the variable gain passive attenuator 134 of FIG. 2B by providing a maximum value of linear resistance between the input port A and the output port B. The maximum value of linear resistance is determined by the total series sum of the resistances, a multiple of resistance Rv, of the resistors 532-538. For instance, when the sub-circuit control terminal receives a control voltage Vcz causing the series cascade of FETs 512-518 to operate in sub-threshold or cutoff, then the resistors 532-538 provide a linear resistance between the input port A and the output port B. This in turn can improve the linearity and reduce distortion of the variable gain passive attenuator 134 when the series cascade of FETs 512-518 operate in sub-threshold or cutoff. Alternatively, when the sub-circuit control terminal $C_Z$ receives a control voltage Vcz causing the series cascade of FETs 512-518 to operate as voltage controlled resistors, then the series cascade of FETs 512-518 provide a controlled resistance in parallel with the resistors 532-538 such that the total resistance between the input port A and the output port B is reduced.

Figure 6A:
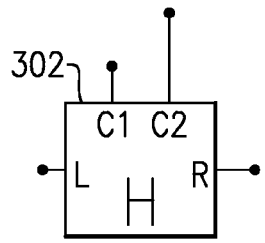
FIGS. 6A and 6B are the hierarchical circuit symbol and circuit schematic of an H (horizontal) sub-circuit according to one embodiment.
Figure 6B:
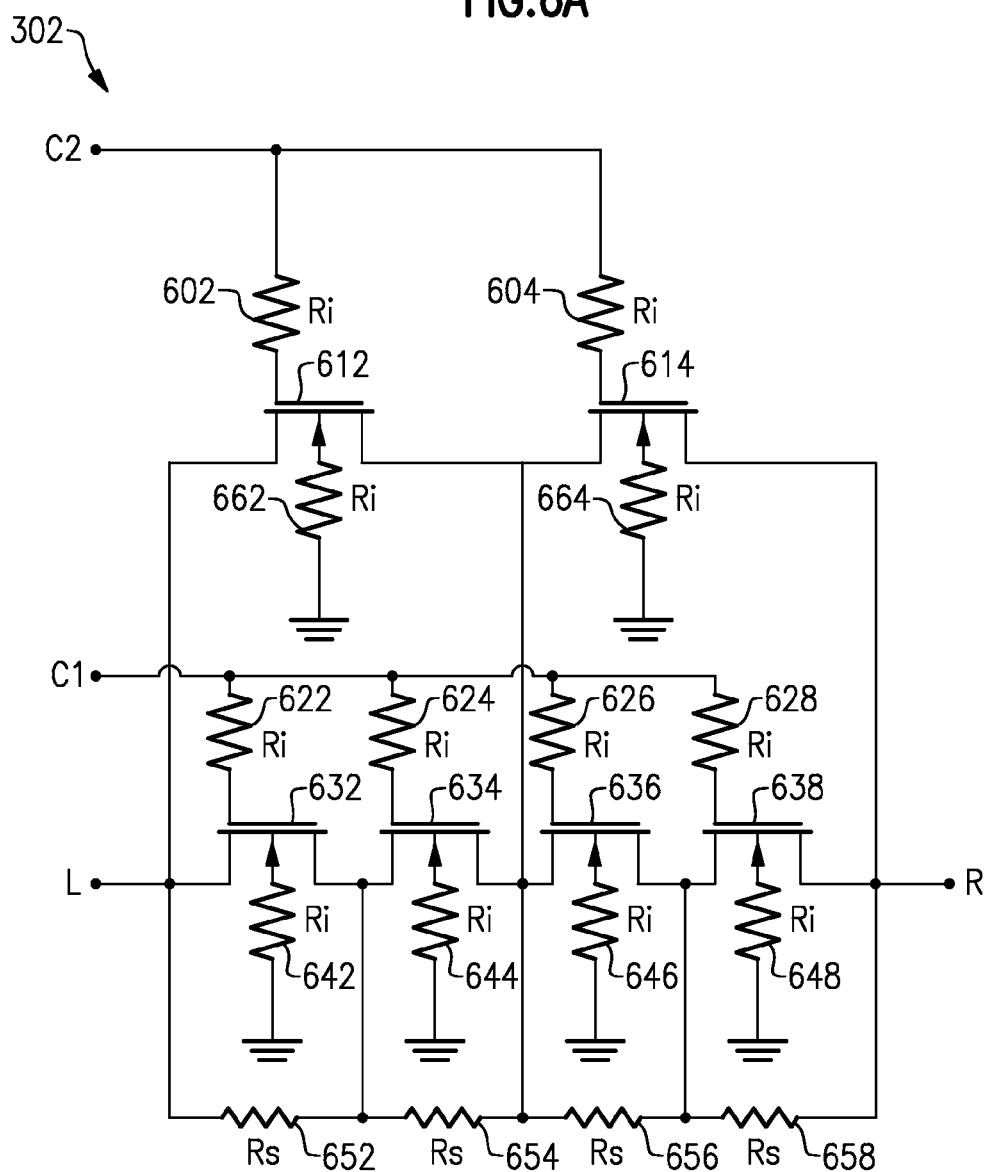

FIGS. 6A and 6B are the hierarchical circuit symbol and circuit schematic of an H (horizontal) block 302 according to one embodiment. The hierarchical circuit symbol of FIG. 6A has an input port L, an output port R, a sub-circuit control terminal C1, and a sub-circuit control terminal C2. The circuit schematic of FIG. 6B, in turn, shows the transistor-level connections to the input port L, the output port R, the sub-circuit control terminal C1, and the sub-circuit control terminal C2.

The H block 302 is a multi-stacked series cascade of FETs and resistors between the input port L and the output port R. Consistent with the embodiment of FIG. 6B, the FETs of the embodiment of FIG. 6B are N-type FETs. A first cascade of FETs 632-638 are electrically connected between the input port L and the output port R. At the input port L side of the cascade, an FET 632 has a source electrically connected to the input port L and a drain electrically connected to a source of an FET 634. At the output port R side of the cascade, an FET 638 has a drain electrically connected to the output port R and a source electrically connected to a drain of an FET 636. Also, the FET 634 has a drain electrically connected the source of the FET 636.

Additionally, as shown in the embodiment of FIG. 6B, each FET from the first cascade of FETs 632-638 has an associated gate and body resistor of resistance Ri. A gate resistor 622 is electrically connected between a gate of the FET 632 and the sub-circuit control terminal C1, and a body resistor 642 is electrically connected between a body of the FET 632 and ground. Similarly, a gate resistor 624 is electrically connected between a gate of the FET 634 and the sub-circuit control terminal C1, and a body resistor 644 is electrically connected between a body of the FET 634 and ground. Next, a gate resistor 626 is electrically connected between a gate of the FET 636 and the sub-circuit control terminal C1, and a body resistor 646 is electrically connected between a body of the FET 636 and ground. Finally, a gate resistor 628 is electrically connected between a gate of the FET 638 and the sub-circuit control terminal C1, and a body resistor 648 is electrically connected between a body of the FET 638 and ground.

Also as shown in FIG. 6B, each FET from the first cascade of FETs 632-638 has an associated parallel resistor of resistance Rs. A resistor 652 is electrically connected between the drain and the source of the FET 632. A resistor 654 is electrically connected between the drain and the source of the FET 634. A resistor 656 is electrically connected between the drain and the source of the FET 636, and finally a resistor 658 is electrically connected between the drain and the source of the FET 638.

Analogous to the resistors 532-538 of FIG. 5B, the resistors 652-658 can advantageously improve the linearity and enhance performance of the variable gain passive attenuator 134 of FIG. 2B by providing a maximum value of linear resistance between the input port L and the output port R. The maximum value of linear resistance is determined by the total series sum of the resistances, a multiple of resistance Rs, of the resistors 652-658.

In contrast to the VERTICAL block 220 of FIG. 5B, the H block 302 uses a multi-stacked series cascade of FETs. In addition to the first cascade of FETs 632-638, the H block 302 includes a second cascade of FETs 612 and 614 stacked with respect to the first cascade of FETs 632-638. Here stacked refers to how the second cascade of FETs 612 and 614 are electrically connected exclusively with respect to the first cascade of FETs 632-638. As shown in FIG. 6B, an FET 612 is stacked across the FET 632 and the FET 634 such that source of the FET 612 is electrically connected to the source of the FET 632 while the drain of the FET 612 is electrically connected to the drain of the FET 634. Similarly, an FET 614 is stacked across the FET 636 and the FET 638 such that the source of the FET 614 is electrically connected to the source of the FET 636 while the drain of the FET 614 is electrically connected to the drain of the FET 638.

Each FET from the second cascade of FETs 612 and 614 has an associated gate and body resistor of resistance Ri. A gate resistor 602 is electrically connected between a gate of the FET 612 and the sub-circuit control terminal C2, and a body resistor 662 is electrically connected between a body of the FET 612 and ground. Similarly, a gate resistor 604 is electrically connected between a gate of the FET 614 and the sub-circuit control terminal C2, and a body resistor 664 is electrically connected between a body of the FET 614 and ground.

Although the embodiment of FIG. 6B shows the H block 302 as having the first cascade of FETs 632-638 stacked with respect to the second cascade of FETs 612 and 614, the H block 302 can have more than two cascades. For instance a third cascade including an additional FET stacked across the FET 634 and the FET 636 can be included, and the third cascade can be associated with a third sub-circuit control terminal C3. Having a third cascade of one or more FETs stacked across the FET 634 and 636 can further enhance insertion loss compared to having just the first and the second cascade of FETs. As will be discussed with respect to FIGS. 7A and 7B, the control terminals can receive ramp control signals having different ramping times.

Additionally, although the embodiments of FIG. 5B and FIG. 6B show the FETs as being NFETs, other configurations using P-type FETs (PFETs) are possible.

The first cascade of FETs 632-638, the second cascade of FETs 612 and 614, and the resistors 652-658 are controlled to operate as variable impedance between the input port L and the output port R by control signals provided at the subsircuit control terminals C1 and C2. The variable impedance is controlled between a maximum value determined by the resistance of the resistors 652-658 and a minimum value determined by a minimum on-state impedance of the first cascade of FETs 632-638 in parallel with a minimum on-state impedance of the second cascade of FETs 612 and 614.

In addition, control signals can be provided at the subcircuit control terminals C1 and C2 so that the impedance between the input port L and the output port R varies in a controlled manner allowing a signal received at the input port L to pass to the output port R without undergoing large distortion. Impedance can be varied gradually by virtue of two control signals provided at the subcircuit control terminals C1 and C2. As the control signals turn on the FETs, the impedance, and hence the attenuation, decreases.

Moreover, having a controllable first cascade of FETs 632-638 and second cascade of FETs 612 and 614 offers an additional degree of freedom in controlling impedance between the input port L and the output port R as compared to having a single cascade of FETs between the input port L and the output port R. By having this additional degree of freedom, the area of the FETs can be made smaller without sacrificing performance, such as insertion loss, in comparison to having a single cascade of FETs. Further, because the FETs can be made smaller, there is less parasitic capacitance, which in turn leads to improved signal integrity. For instance, having less parasitic capacitance allows a signal to pass between the input port L and the output port R with less distortion and with less bandwidth loss. The following FIG. 7A provides further detail of exemplary control signals for high performance linear operation.

Figure 7A:
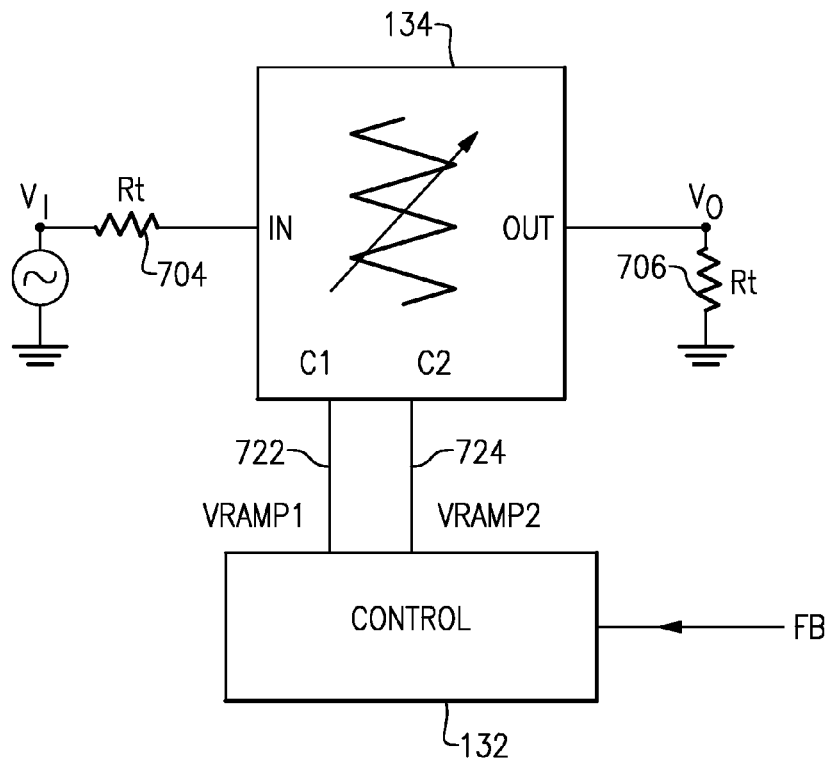
FIG. 7A is a system level diagram of a control circuit and a variable gain passive attenuator in accordance with the teachings herein.

FIG. 7A is a system level diagram of a control circuit 132 and a variable gain passive attenuator 134 in accordance with the teachings herein. The control circuit 132 receives a feedback signal FB and, in response to the feedback signal FB, provides a first control signal VRAMP1 to the control terminal C1 and a second control signal VRAMP2 to the control terminal C2 of the variable gain passive attenuator 134.

Figure 7B:
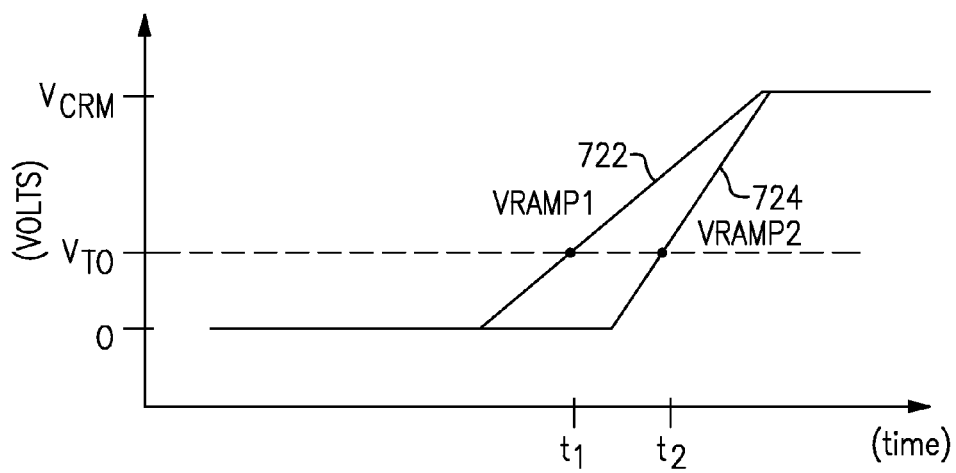
FIG. 7B is plot of voltage vs. time of a first control signal VRAMP1 and a second control signal VRAMP2 from the control circuit according to one embodiment.

FIG. 7B is plot of voltage vs. time of a first control signal VRAMP1 and a second control signal VRAMP2 from the control circuit 134 according to one embodiment. The control circuit 132 of FIG. 7A, in response to the feedback signal FB, can provide the control signal VRAMP1 and VRAMP2 such that the FETs of the first stack are turned on before the FETs of the second stack turn on. As shown in FIG. 7B, the first control signal VRAMP1 reaches a voltage less a threshold voltage level $V_{TO}$ at time $t_1$ before the second control signal VRAMP2 reaches the voltage level $V_{TO}$ at time $t_2$. In this case the voltage level $V_{TO}$ is a control voltage level where an FET transitions from operating in subthreshold or cutoff to operating in active or resistive mode. The active operating region of an FET can also be referred to as saturation or the saturation region of operation.

Both VRAMP1 and VRAMP2 reach a final voltage value equal to $V_{CRM}$ where $V_{CRM}$ can be an analog voltage determined by a feedback loop. For instance, the feedback signal FB can be derived from a coupler sensing an output voltage to control an attenuation level of the variable gain passive attenuator 134. Although both control signals VRAMP1 and VRAMP2 are shown as linear ramps, the control signals VRAMP1 and VRAMP2 can be nonlinear ramps where the control signal VRAMP2 reaches the voltage level $V_{TO}$ at time $t_2$ after the control signal VRAMP1 reaches the voltage level $V_{TO}$ at a time $t_1$.

Additionally, constructing a variable gain passive attenuator using a multi-stack series of cascade of FETs with two control signals VRAMP1 and VRAMP2 as depicted in FIG. 7B can advantageously allow the use of smaller FETs compared to constructing a variable gain passive attenuator using a single series cascade of FETs with one control signal. This in turn can improve the performance of the variable gain passive attenuator having multi-stacked series cascades of FETs by reducing parasitics and reducing insertion loss associated with FET area. Insertion loss is determined to a large extent by FET on resistance in parallel with total series resistance. Furthermore, the second set or stack of series cascaded FETs can occupy less die area because there can be a factor of two or more fewer number of FETs in the second stack receiving the control signal VRAMP2. Also, in addition to reducing insertion loss, having FETs of reduced size improves linearity and allows the variable gain passive attenuator to operate with lower distortion.

Although FIGS. 7A and 7B present a variable gain passive attenuator with two control signals VRAMP1 and VRAMP2, other configurations are possible. For instance, as discussed with respect to FIG. 6B, an attenuator can have an additional sub-circuit control terminal C3. The sub-circuit control terminal C3 can receive a control signal VRAMP3 having a different ramp rate than either control signal VRAMP1 or VRAMP2. When the control signal VRAMP3 rises at a rate so as to be steeper than a rate of the control signal VRAMP1 but less steep than a rate of the control signal VRAMP2, the insertion loss can be further reduced. In this way the transfer curve of input voltage verses output attenuation can be further linearized.

Figure 8A:
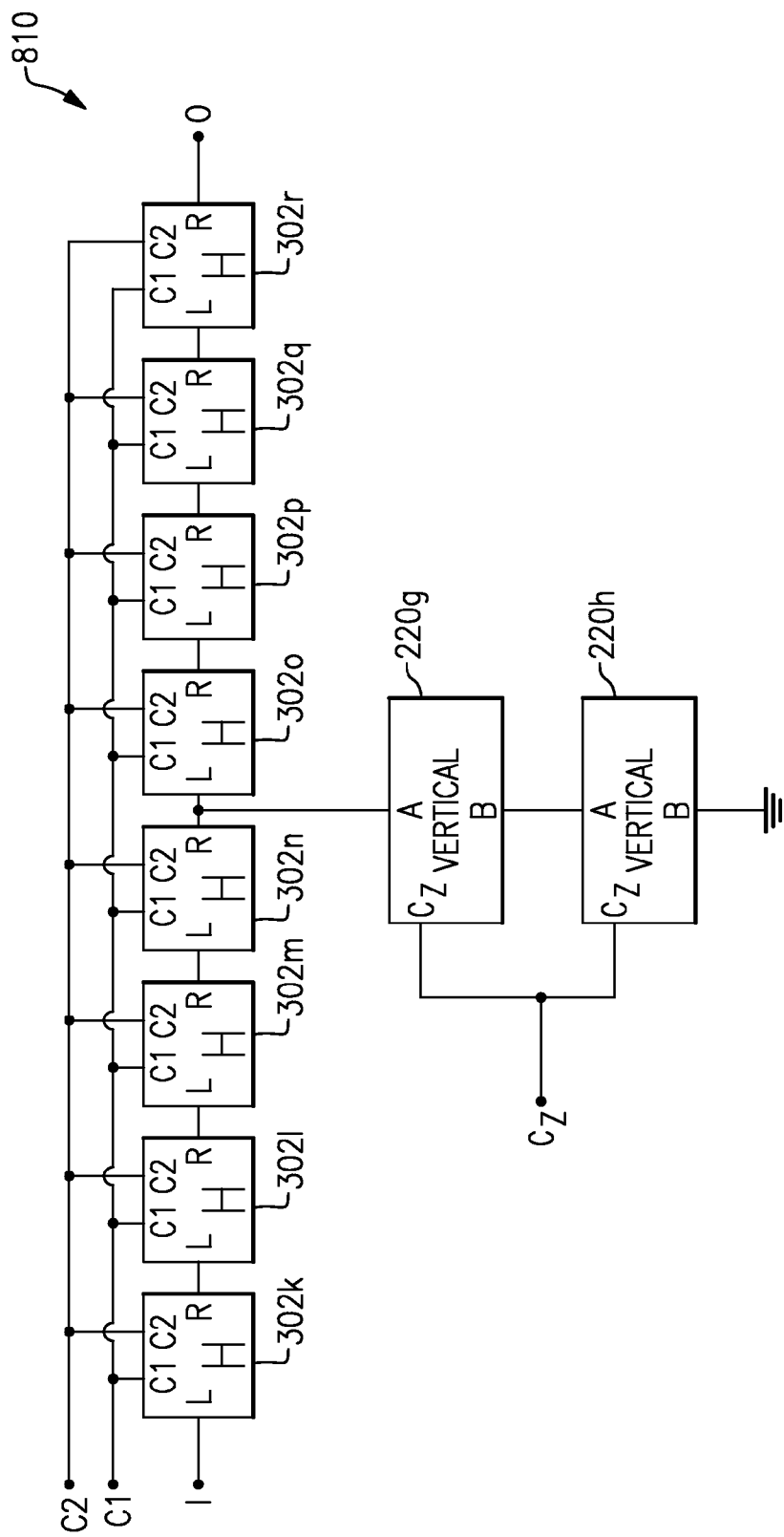
FIG. 8A is the circuit schematic of a T-type attenuator in accordance with the teachings herein.

Similar to the embodiment of FIG. 2B, other embodiments of variable gain passive attenuators using sub-circuits or blocks are possible. For instance, FIG. 8A is the circuit schematic of a T-type attenuator 810 in accordance with the teachings herein. The T-type attenuator has a series cascade of H blocks 302k-302r electrically connected in series between an input port I and an output port O. In addition there is a set of VERTICAL blocks 220g and 220h electrically connected between the series cascade of H blocks 302k-302r and ground so as to form a "T". The H blocks 302k-302r each have a sub-circuit control terminal C1 and a sub-circuit control terminal C2, while the VERTICAL blocks 220g and 220h each have a sub-circuit control terminal $C_Z$. The control terminal $C_Z$ can receive a control signal Vcz while the sub-circuit control terminals C1 and C2 can receive control signals VRAMP1 and VRAMP2.

Figure 8B:
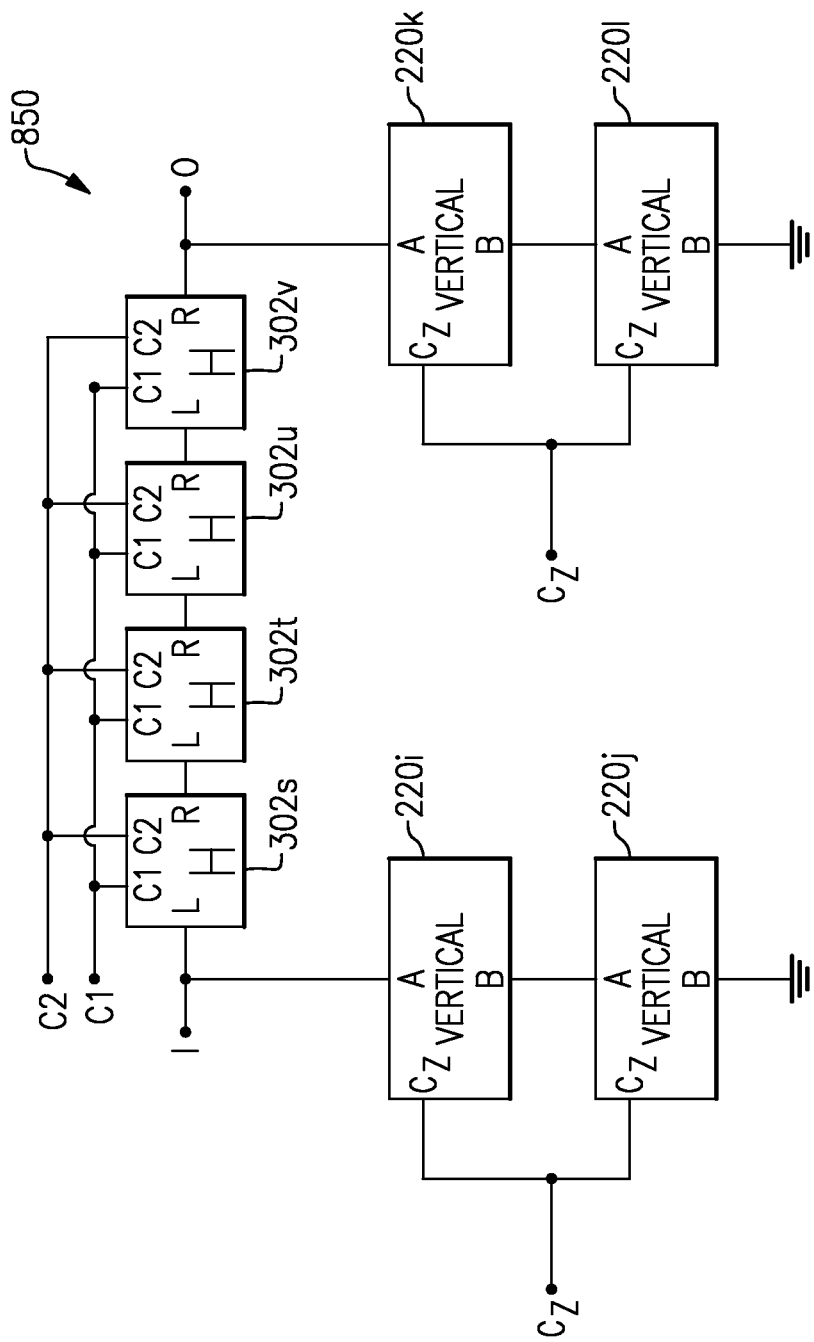
FIG. 8B is the circuit schematic of a Pi-type attenuator in accordance with the teachings herein.

FIG. 8B is the circuit schematic of a Pi-type attenuator 850 in accordance with the teachings herein. The Pi-type attenuator has a series cascade of H blocks 302s-302v electrically connected in series between an input port I and an output port O. In addition there is a first set of VERTICAL blocks 220i-220j and a second set of VERTICAL blocks 220k-l electrically connected between the series cascade of H blocks 302k-302r and ground so as to form a "Pi". The H blocks 302s-302v each have a sub-circuit control terminal C1 and a sub-circuit control terminal C2, while the VERTICAL blocks 220g and 220h each have a sub-circuit control terminal $C_Z$. The control terminal $C_Z$ can receive a control signal Vcz while the sub-circuit control terminals C1 and C2 can receive control signals VRAMP1 and VRAMP2.

Applications

Devices employing the above described variable gain passive attenuators can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. A variable gain passive attenuator configured to attenuate a signal between an input port and an output port, the attenuator comprising:
   a supply node;
   a plurality of parallel attenuation paths each comprising one or more cascade transistors that extend between the input port and the output port, wherein each path has a different attenuation level, and wherein a first path has a first number of transistors and a second path has a second number of transistors different than the first number;
   at least one supply attenuation path that extends between the plurality of attenuation paths and the supply node;
   a controller that supplies a plurality of control signals to the plurality of parallel attenuation paths and the at least one supply attenuation path and selects one or more paths to achieve a desired level of attenuation between the input port and the output port wherein the controller provides control signals to separately enable at least two of the attenuation paths.

2. The variable gain passive attenuator of claim 1,
   wherein the plurality of control signals comprise a first control signal and a second control signal sequenced in time so as to turn on the one or more cascade transistors of the first path at a first time and to turn on the one or more cascade transistors of the second path at a second time;
   wherein the first control signal has a first rate of change with respect to time and the second control signal has a second rate of change with respect to time;
   wherein the first rate of change with respect to time, the second rate of change with respect to time, the first time, and the second time are selected to reduce a distortion of a signal of the input port and to increase linearity of the plurality of parallel attenuation paths while lowering an insertion loss between the input port and the output port.

3. The variable gain passive attenuator of claim 2,
   wherein the first control signal controls the one or more cascade transistors of the first path to operate in the on state before the second control signal controls the one or more cascade transistors of the second path to operate in the on state; and
   wherein the rate of change with respect to time of the first control signal is greater than the rate of change with respect to time of the second control signal.

4. The variable gain passive attenuator of claim 3, further comprising:
a first parallel resistor path having a plurality of resistors electrically connected in series between the input port and the output port, wherein the first parallel resistor path defines a first resistive impedance path between the input port and the output port; and
wherein each resistor is connected in parallel with at least one of the one or more cascade transistors of at least one of the parallel attenuation paths.

5. The variable gain passive attenuator of claim 1,
wherein the first number of transistors is greater than the second number of transistors; and
wherein each transistor of the one or more cascade transistors of the second path is electrically connected across two or more transistors of the one or more cascade transistors of the first path such that the one or more cascade transistors of the second path are stacked with respect to the one or more cascade transistors of the first path.

6. The variable gain passive attenuator of claim 1,
wherein the at least one supply attenuation path that extends between the plurality of attenuation paths and the supply node comprises one or more cascade transistors.

7. The variable gain passive attenuator of claim 6, further comprising an impedance control module configured to provide a third control signal to the one or more cascade transistors of the at least one supply attenuation path that extends between the plurality of attenuation paths and the supply node so as to adjust an input impedance and an output impedance of the variable gain passive attenuator to substantially equal a target impedance.

8. The impedance control module of claim 7 comprising:
a replica attenuator configured to attenuate a signal between an auxiliary input port and an auxiliary output port by a replicated attenuation level controlled by the plurality of control signals, wherein an input impedance and an output impedance of the replica attenuator are controlled to substantially equal a replica target impedance by the third control signal, and wherein the replicated attenuation level is substantially equal to a replica scale factor times the desired level of attenuation; and
a feedback loop comprising the replica attenuator and an amplifier, wherein the amplifier is configured to provide the third control signal to the replica attenuator so as to cause the replica target impedance to substantially equal a scale factor times the target impedance.

9. The impedance control module of claim 8, wherein the scale factor is equal to two.

10. The variable gain passive attenuator of claim 7, wherein the cascade transistors are NFETs.

11. A variable gain passive attenuator configured to attenuate a signal between an input port and an output port by an attenuation level controlled by a first control signal and a second control signal, wherein an input impedance and an output impedance of the variable gain passive attenuator are controlled to equal a target impedance by a third control signal, and wherein the variable gain passive attenuator comprises:
a first supply node;
a first series of cascade FETs configured to receive the first control signal, wherein the first series of cascade FETs defines a first FET impedance path providing a first variable impedance between the input port and the output port, and wherein the first series of cascade FETs comprises a first plurality of FETs each having a source and a drain electrically connected as a series node of the first FET impedance path;
a second series of cascade FETs configured to receive the second control signal, wherein the second series of cascade FETs defines a second FET impedance path providing a second variable impedance between the input port and the output port, wherein the second series of cascade FETs comprises at least one FET having a source and a drain electrically stacked across two or more FETs of the first series cascade FETs, wherein the number of FETs of the at least one FET is less than the number of FETs of the first plurality of FETs; and
a third series of cascade FETs configured to receive the third control signal, wherein the third series of cascade FETs defines a third FET impedance path between a first series node of the first FET impedance path and the first supply node.

12. The variable gain passive attenuator of claim 11, further comprising a first parallel resistor path having a plurality of resistors, wherein the first parallel resistor path defines a first resistive impedance path between the input port and the output port.

13. The variable gain passive attenuator of claim 12,
wherein across the source and the drain of each FET of the first plurality of FETs a resistor of the plurality of resistors is electrically connected in parallel; and
wherein the number of FETs of the first plurality of FETs equals the number of resistors of the plurality of resistors.

14. The variable gain passive attenuator of claim 11,
wherein the attenuation level is further controlled by a fourth control signal; and
wherein the variable gain passive attenuator further comprises a fourth series of cascade FETs configured to receive the fourth control signal, wherein the fourth series of cascade FETs defines a fourth FET impedance path providing a fourth variable impedance between the input port and the output port, wherein the fourth series of cascade FETs comprises at least one FET having a source and a drain electrically stacked across two or more FETs of the second series of cascade FETs, wherein the number of FETs of the at least one FET of the fourth series of cascade FETs is less than the number of FETs of the at least one FET of the second series of cascade FETs.

15. The variable gain passive attenuator of claim 11, further comprising a second parallel resistor path having a plurality of resistors,
wherein the second parallel resistor path defines a second resistive impedance path between the first series node of the first FET impedance path and the first supply node; and
wherein the third series of cascade FETs comprises a plurality of FETs each having a source and a drain electrically connected as a series node of the third FET impedance path.

16. The variable gain passive attenuator of claim 15,
wherein across the source and the drain of each FET of the plurality of FETs a resistor of the plurality of resistors is electrically connected in parallel; and
wherein the number of FETs of the plurality of FETs equals the number of resistors of the plurality of resistors.

17. The variable gain passive attenuator of claim 11, further comprising a controller configured to provide the first and second control signals at spaced time intervals so as to selectively change the first variable impedance before changing the second variable impedance.

18. The variable gain passive attenuator of claim 17, wherein the first control signal controls the first plurality of FETs to transition from operating in subthreshold or cutoff to operating in resistive or active mode before the second control signal controls the at least one FET of the second series cascade of FETs to transition from operating in subthreshold or cutoff to operating in resistive or active mode.

19. The variable gain passive attenuator of claim 11, further comprising an impedance control module configured to provide the third control signal so as to adjust the input and the output impedance of the variable gain passive attenuator to equal the target impedance.

20. The impedance control module of claim 19 comprising:
  a replica attenuator configured to attenuate a signal between an auxiliary input port and an auxiliary output port by a replicated attenuation level controlled by the first control signal and the second control signal, wherein an input impedance and an output impedance of the replica attenuator are controlled to equal a replica target impedance by the third control signal, and wherein the replicated attenuation level is equal to a replica scale factor times the attenuation level;
  a feedback loop comprising the replica attenuator and an amplifier, wherein the amplifier is configured to provide the third control signal to the replica attenuator so as to cause the replica target impedance to equal a scale factor times the target impedance.

21. The impedance control module of claim 20, wherein the scale factor is equal to two.

22. The impedance control module of claim 11, wherein the second variable impedance is larger than the first variable impedance.

23. The variable gain passive attenuator of claim 11, wherein the first supply node is ground.

24. The variable gain passive attenuator of claim 11, wherein the variable gain passive attenuator is a T-type attenuator.

25. The variable gain passive attenuator of claim 11, further comprising:
  a fourth series of cascade FETs configured to receive the third control signal, wherein the fourth series of cascade FETs defines a fourth FET impedance path between a second series node of the first FET impedance path and the first supply node.

26. The variable gain of claim 25, further comprising a third parallel resistor path having a plurality of resistors,
  wherein the third parallel resistor path defines a third resistive impedance path between the second series node of the first FET impedance path and the first supply node; and
  wherein the fourth series of cascade FETs comprises a plurality of FETs each having a source and a drain electrically connected as a series node of the fourth FET impedance path.

27. The variable gain of claim 26,
  wherein across the source and the drain of each FET of the plurality of FETs a resistor of the plurality of resistors is electrically connected in parallel; and
  wherein the number of FETs of the plurality of FETs equals the number of resistors of the plurality of resistors.

28. The variable gain passive attenuator of claim 25,
  wherein the variable gain passive attenuator either is a Pi-type attenuator or a multi-T-type attenuator; and
  wherein the first, second, third, and fourth series of cascade FETs comprise either NFETs or PFETs.

* * * * *